(12) United States Patent
Watanabe

(10) Patent No.: US 7,033,860 B2
(45) Date of Patent: Apr. 25, 2006

(54) PROCESS FOR MANUFACTURING SEMICONDUCTOR DEVICE

(75) Inventor: Shoji Watanabe, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/898,979

(22) Filed: Jul. 27, 2004

(65) Prior Publication Data

US 2005/0026328 A1 Feb. 3, 2005

(30) Foreign Application Priority Data

Jul. 31, 2003 (JP) .............................. 2003-283634

(51) Int. Cl.
*H01L 21/58* (2006.01)

(52) U.S. Cl. ...................... 438/107; 438/118

(58) Field of Classification Search ........ 438/107–118; 257/686, 777

See application file for complete search history.

(56) References Cited

U.S. PATENT DOCUMENTS

| 6,225,688 B1 * | 5/2001 | Kim et al. ................... 257/686 |
| 6,884,653 B1 * | 4/2005 | Larson ........................ 438/107 |
| 6,940,158 B1 * | 9/2005 | Haba et al. ................. 257/686 |

FOREIGN PATENT DOCUMENTS

| JP | 2000-307037 | 11/2000 |
| JP | 2003-86760 | 3/2003 |
| JP | 2003-86761 | 3/2003 |

\* cited by examiner

*Primary Examiner*—Cuong Nguyen
(74) *Attorney, Agent, or Firm*—Staas & Halsey LLP

(57) ABSTRACT

A process for manufacturing a semiconductor device, the process comprising the steps of: covering an electrode terminal forming surface of a semiconductor wafer, on which a plurality of semiconductor elements are formed and arranged, with a cover layer comprising a flexible insulating film on which re-wiring patterns are formed, to adhere the cover layer to the electrode terminal forming surface, in such a manner that electrode terminals of the semiconductor elements are electrically connected with connecting terminals of the re-wiring patterns; forming the semiconductor wafer with grooves from the surface opposite to the electrode terminal forming surface thereof, so that the grooves extend along boundary lines of the semiconductor elements; dividing the semiconductor wafer with the cover layer to obtain a plurality of units, each unit comprising a plurality of the semiconductor elements and a sub-divided cover layer to define a single semiconductor device; and folding the cover layer of the respective divided unit along the grooves, so that at least some of the semiconductor elements in the respective unit are stacked.

4 Claims, 5 Drawing Sheets

PROCESS FOR MANUFACTURING SEMICONDUCTOR DEVICE

BACKGROUND OF THE INVENTION

1. Field of the Invention

The present invention relates to a process for manufacturing a semiconductor device and, more specifically, it relates to a process for manufacturing a semiconductor device wherein semiconductor elements are laminated together in a stage of semiconductor wafers and capable to be mounted.

2. Description of the Related Art

As shown in FIGS. 6(a) to 6(c), there is a product wherein semiconductor elements 12 (FIG. 6b) are carried on a flexible wiring board 10 (FIG. 6a) provided with external connection terminals 14 in a mounting area and the flexible wiring board 10 is folded as shown in FIG. 6c to stack the semiconductor elements 12 together (for example, in Japanese Unexamined Patent Publication (Kokai) Nos. 2000-307037, 2003-86760 and 2003-86761). Since a plurality of semiconductor elements can be mounted on one semiconductor device, the semiconductor device formed by stacking the semiconductor elements in such a manner is advantageous in that it is compact in size and large in capacity.

A recent semiconductor element is made extremely thin, such as 100 µm or less, by grinding, and it is possible to form a sufficiently small semiconductor device by stacking together a plurality of the semiconductor elements.

As mentioned above, a method for mounting a plurality of stacked semiconductor elements on a single semiconductor device is effective for forming a highly integrated semiconductor device small in size. However, the prior art method for forming the semiconductor device by carrying a plurality of semiconductor elements on a flexible wiring board and folding the latter is problematic because this method needs a flexible wiring board having a predetermined wiring pattern and accurate positioning of the semiconductor elements to the flexible wiring board, and the production and assembly, of the respective parts, are costly.

SUMMARY OF THE INVENTION

The present invention has been made to solve the problems in the prior art, and an object thereof is to provide a process for easily manufacturing a highly integrated semiconductor device by stacking a plurality of semiconductor elements together while reducing the production cost.

According to the present invention, there is provided a process for manufacturing a semiconductor device, the process comprising the following steps of: covering an electrode terminal forming surface of a semiconductor wafer, on which a plurality of semiconductor elements are formed and arranged, with a cover layer comprising a flexible insulating film on which re-wiring patterns are formed, to adhere the cover layer to the electrode terminal forming surface, so that electrode terminals of the semiconductor elements are electrically connected with connecting terminals of the re-wiring patterns; forming the semiconductor wafer with grooves from a surface opposite to the electrode terminal forming surface of the semiconductor wafer, so that the grooves extend along boundary lines of the semiconductor elements; dividing the semiconductor wafer with the cover layer to obtain a plurality of units, each unit comprising a plurality of the semiconductor elements and a single sub-divided cover layer to define a single semiconductor device; and folding the cover layer of the respective divided unit along the grooves, so that at least some of the semiconductor elements in the respective unit are stacked.

The semiconductor wafer is divided by the cover layer in such a manner that, in each unit, a plurality of the semiconductor elements are connected one by one in series.

The process further comprises the following steps of: forming the re-wiring patterns on the flexible insulating film and, simultaneously, forming lands, on an area of the flexible insulating film to be a mounting surface of the resulted semiconductor device; and attaching external connection terminals to the lands.

The process further comprises the following step of: grinding the surface opposite to the electrode terminal forming surface of the semiconductor wafer to reduce the thickness of the semiconductor wafer, before the semiconductor wafer is formed with grooves from the opposite surface.

According to another aspect of the present invention, there is provided a process for manufacturing a semiconductor device, the process comprising the following steps of: half-cutting an electrode terminal forming surface of a semiconductor wafer, on which a number of semiconductor elements are formed and arranged, so that the resulting half-cut grooves extend along boundary lines of the semiconductor elements; covering the electrode terminal forming surface of the semiconductor wafer with a cover layer comprising a flexible insulating film on which re-wiring patterns are formed, to adhere the cover layer to the electrode terminal forming surface, so that electrode terminals of the semiconductor elements are electrically connected with the connecting terminals of the re-wiring patterns; grinding the surface opposite to the electrode terminal forming surface of the semiconductor wafer, so that the grooves are exposed to the outside; dividing the semiconductor wafer with the cover layer along some of the grooves to obtain a plurality of units, each unit comprising a plurality of the semiconductor elements and a single sub-divided cover layer to be a single semiconductor device; and folding the cover layer of the respective divided unit along the grooves, so that at least some of the semiconductor elements in the respective unit are stacked.

The semiconductor wafer is divided with the cover layer in such a manner that, in each unit, a plurality of the semiconductor elements are connected one by one in series.

The process further comprises the following steps of: forming the re-wiring patterns on the flexible insulating film and, simultaneously, forming lands, on an area of the flexible insulating film to be a mounting surface of the resulted semiconductor device; and attaching external connection terminals to the lands.

According to still another aspect of the present invention, there is provided a process for manufacturing a semiconductor device, the process comprising the following steps of: covering an electrode terminal forming surface of a semiconductor wafer, on which a plurality of semiconductor elements are formed and arranged, with a cover layer comprising a flexible insulating film on which re-wiring patterns are formed, to adhere the cover layer to the electrode terminal forming surface, so that electrode terminals of the semiconductor elements are electrically connected with connecting terminals of the re-wiring patterns; forming the semiconductor wafer with grooves from a surface opposite to the electrode terminal forming surface of the semiconductor wafer, so that the grooves extend along boundary lines of the semiconductor elements; and folding the cover layer along the grooves, so that at least some of the semiconductor elements are stacked.

According to still another aspect of the present invention, there is provided a process for manufacturing a semiconductor device, the process comprising the following steps of: half-cutting an electrode terminal forming surface of a semiconductor wafer on which a number of semiconductor elements are formed and arranged, so that resulted half-cut grooves extend along boundary lines of the semiconductor elements; covering the electrode terminal forming surface of the semiconductor wafer with a cover layer comprising a flexible insulating film on which re-wiring patterns are formed, to adhere the cover layer to the electrode terminal forming surface, so that electrode terminals of the semiconductor elements are electrically connected with the connecting terminals of the re-wiring patterns; grinding the surface opposite to the electrode terminal forming surface of the semiconductor wafer, so that the grooves are exposed to the outside; and folding the cover layer along the grooves, so that at least some of the semiconductor elements are stacked.

According to the inventive method for manufacturing a semiconductor device, as a support, a wiring pattern or others is formed to be capable of mounting semiconductor elements in a stacked state in a so-called semiconductor wafer stage, it is possible to easily and effectively manufacture the semiconductor device wherein a plurality of semiconductor elements are stacked together. Also, as the semiconductor device is formed by cutting a semiconductor wafer into individual pieces, it is possible to provide an extremely compact semiconductor device.

BEST MODE FOR CARRYING OUT THE INVENTION

The preferred embodiments of the present invention will be described below, in detail, with reference to the attached drawings.

FIGS. 1(a) to 1(f) illustrate a first embodiment of the inventive method for manufacturing a semiconductor device. According to the inventive method for manufacturing a semiconductor device, a semiconductor wafer carrying an insulating layer, a wiring pattern and external connection terminals on a surface thereof in a stage of a semiconductor wafer is divided into individual pieces so that a plurality of semiconductor elements constituting one semiconductor device are connected to each other by the insulating layer to form one piece, which is then folded to stack the semiconductor elements on each other. That is, the semiconductor device is characterized in that the semiconductor elements are stacked together in a so-called wafer stage.

Figure 1A:
FIGS. 1(a) to 1(f) illustrate a first embodiment of the inventive method for manufacturing a semiconductor device.

In FIG. 1(a), a semiconductor wafer 20 is shown, in which semiconductor elements are arranged to form predetermined sections. In this regard, "A" denotes one section.

Figure 1B:
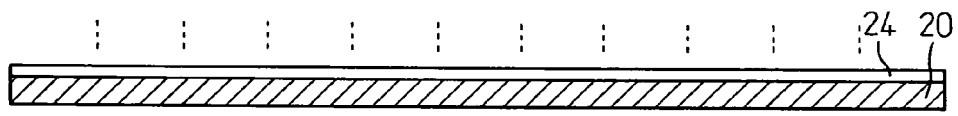
Figure 1C:
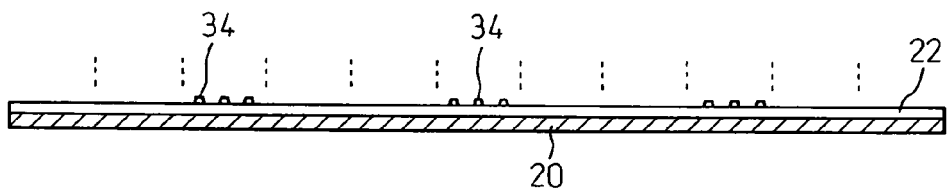
Figure 1D:
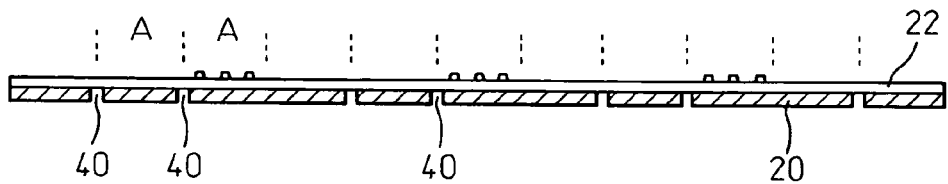
Figure 1E:
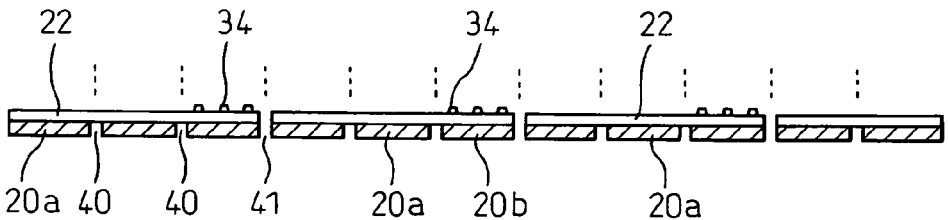
Figure 1F:
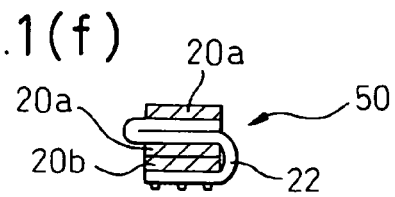

In FIG. 1(b), a surface of the semiconductor wafer 20, on which electrode terminals are formed, is covered with an insulating layer 24. A re-wiring pattern is formed as a wiring pattern for connecting the electrode terminal of the semiconductor wafer 20 to the external connection terminal. In this embodiment, as the semiconductor elements are stacked together to form one semiconductor device, one re-wiring pattern is allocated to three semiconductor elements forming one unit.

In FIGS. 2(a) to 2(e), a process, for forming the insulating layer 24 and the re-wiring pattern 28 on the surface of the semiconductor wafer 20 on which the electrode terminals are formed as one unit, is illustrated. Reference numeral 20a and 20b denotes the respective semiconductor element formed in the semiconductor wafer 20.

Figure 2A:
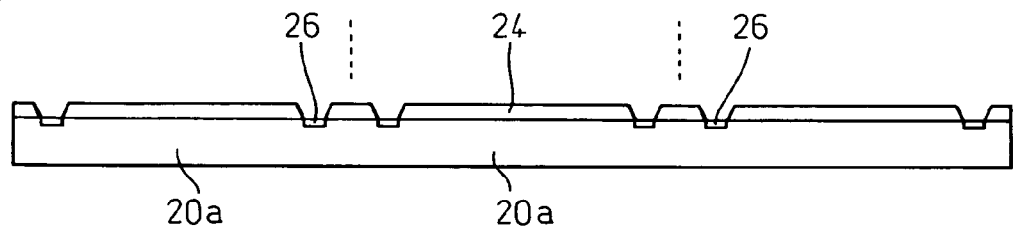
FIGS. 2(a) to 2(e) illustrate structures of a wiring layer or others in an enlarged manner during the manufacturing process.

In FIG. 2(a), the insulating layer 24 is formed by laminating an electrically-insulating film, such as a polyimide film, on the surface of the semiconductor wafer 20 on which are formed the electrode terminals, and specified areas of the insulating layer 24 are etched to expose the electrode terminals 26. The film forming the insulating layer 24 connects the respective semiconductor elements 20a with each other to support them when the semiconductor elements 20a are stacked together to form the semiconductor device, and is formed of a foldable flexible film material. The film material forming the insulating layer 24 preferably has a thickness in a range from approximately 10 to 25 μm. While a portion in which three semiconductor elements are consecutive is shown in FIG. 2, the film member is provided to cover all over the surface of the semiconductor wafer 20 on which the electrode terminals are formed.

Figure 2B:
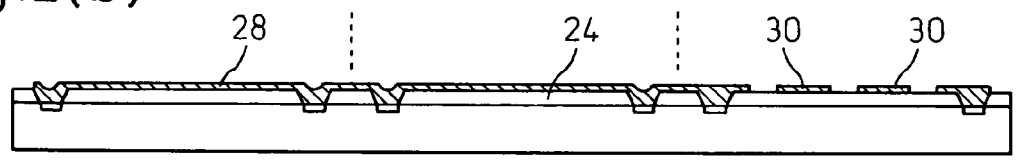
Figure 2C:
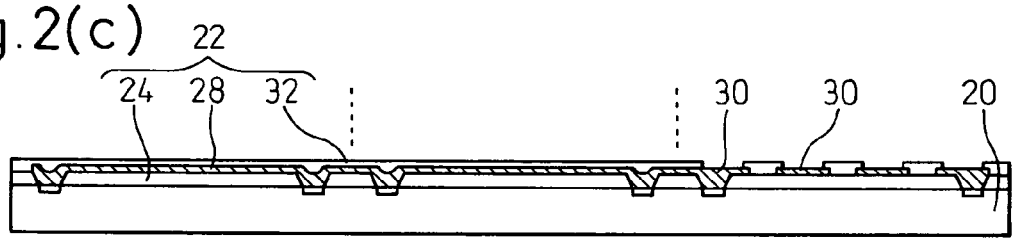
Figure 2D:
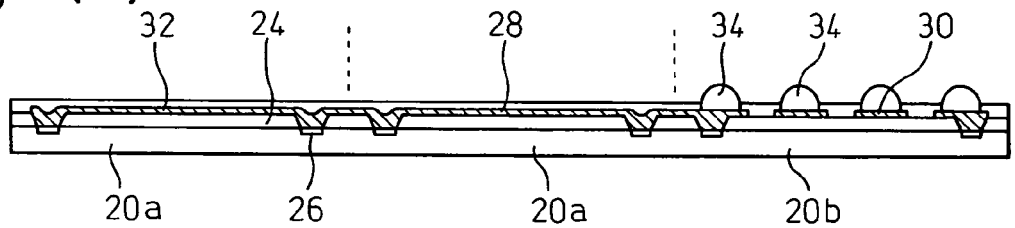
Figure 2E:
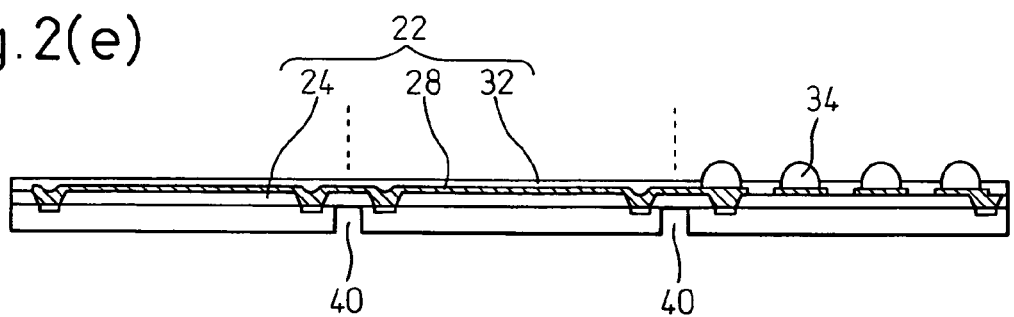

In FIG. 2(b), a conductive layer is formed on the surface of the insulating layer 24 by plating or sputtering and, then, is etched with a predetermined pattern to form the re-wiring pattern 28. Reference numeral 30 denotes a land for connecting to the external connection terminal, and 20b denotes a semiconductor element to be arranged on a mounting surface when the semiconductor elements are stacked together. The land 30 is formed on a surface of the semiconductor element on which the electrode terminal is formed.

In FIG. 2(*c*), after forming the re-wiring pattern 28, the surface of the semiconductor wafer 20 on which the electrode terminals are formed is covered with a protective film 32 such as solder resist, except for the exposed portion of the land 30. A cover layer 22 for covering the electrode terminal-forming surface of the semiconductor wafer 20 includes the insulating layer 24, the re-wiring pattern 28 and the protective film 32.

In FIG. 2(*d*), after the rear surface of the semiconductor wafer 20 has been ground to make the semiconductor wafer 20 thin, an external terminal 34 such as a solder ball is connected to the respective lands 30. Usually, the semiconductor wafer 20 has a thickness in a range from approximately 300 to 500 μm. In this grinding process, the semiconductor wafer 20 is ground to have a thickness of approximately 50 μm. As the thickness of the individual semiconductor element 20a is directly related to a total thickness of the semiconductor device, it is possible to decrease the thickness of the semiconductor device when the semiconductor elements 20a are stacked together to be the semiconductor device, by making the semiconductor wafer 20 thin.

Figure 3:
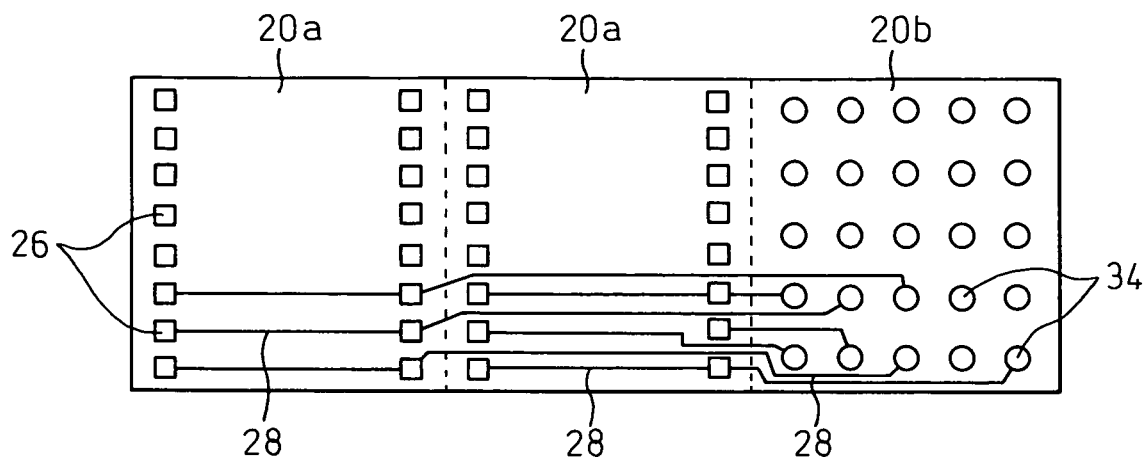
FIG. 3 illustrates the planar arrangement of re-wiring patterns and lands.
Figure 4A:
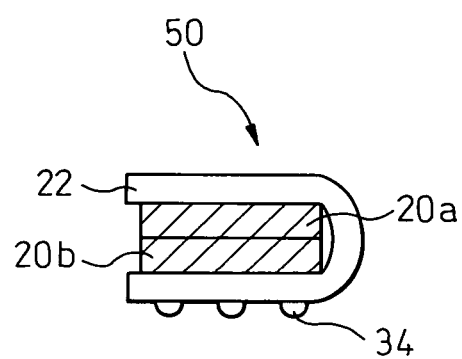
FIGS. 4(a) to 4(d) illustrate examples of the semiconductor device.
Figure 4B:
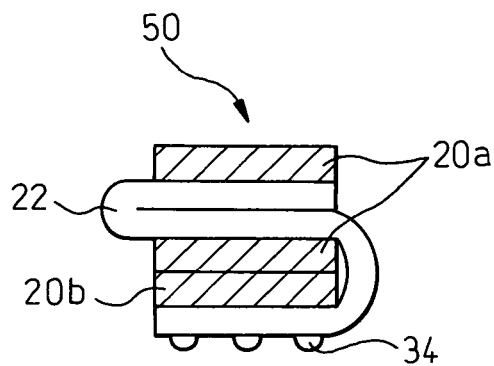
Figure 4C:
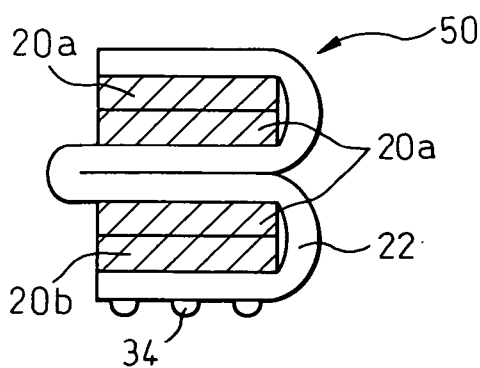
Figure 4D:
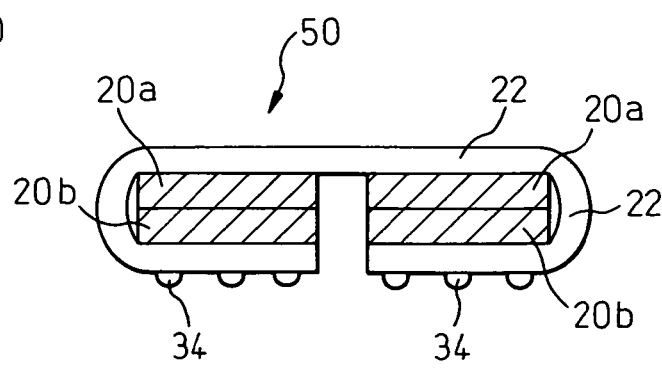
Figure 5A:
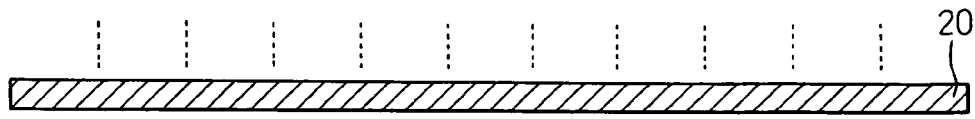
FIGS. 5(a) to 5(f) illustrate a second embodiment of the inventive method for manufacturing a semiconductor device.
Figure 5B:
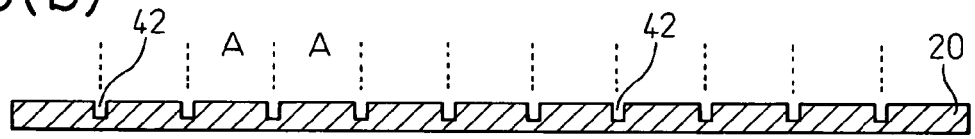
Figure 5C:
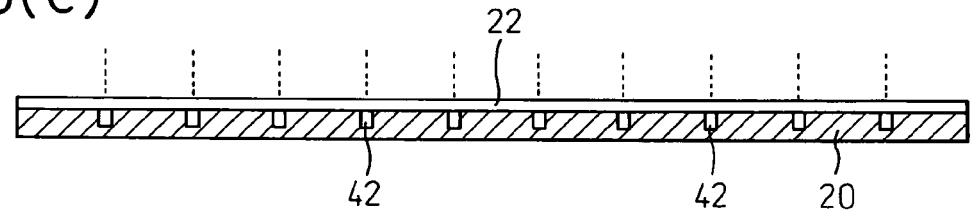
Figure 5D:
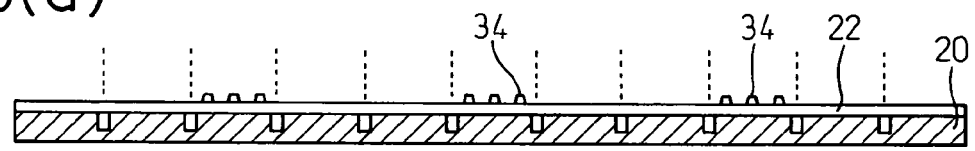
Figure 5E:
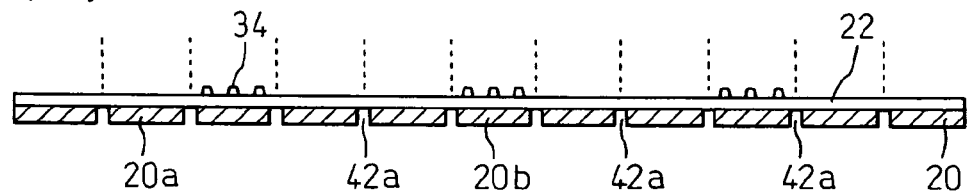
Figure 5F:
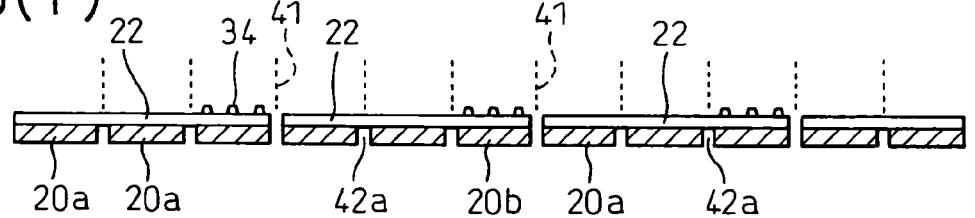
Figure 6A:
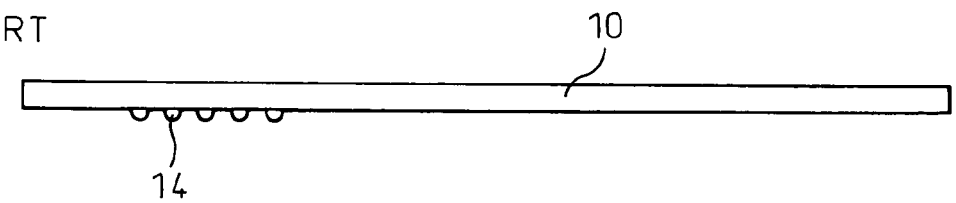
FIGS. 6(a) to 6(c) illustrate a prior art method for manufacturing a semiconductor device by stacking semiconductor elements together.
Figure 6B:
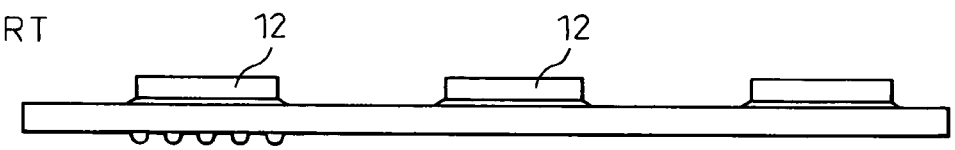
Figure 6C:
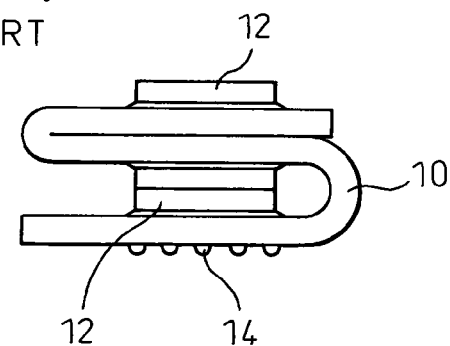

In FIG. 1(*c*), the external connection terminals 34 are bonded to the land 30 of the cover layer 22 covering the surface of the semiconductor wafer 20. In this embodiment, the external connection terminals 34 are bonded to the land 30 after the rear surface of the semiconductor wafer 20 has been ground. However, this is not limitative, and it is also possible to bond the external connection terminals 34 prior to grinding the semiconductor wafer 20 or directly before the semiconductor device is mounted. In FIG. 3, the planar arrangement of the re-wiring pattern 28 and the external connection terminals 34 formed on the electrode terminal-forming surface of the semiconductor wafer 20 is illustrated. In FIG. 3, three semiconductor elements in one unit for constituting one semiconductor device are illustrated to simplify the explanation. Regarding the other semiconductor elements, the re-wiring patterns 28 and the external connection terminals 34 are arranged in the same manner as above in every unit, to constitute one semiconductor device.

According to this embodiment, one semiconductor device is formed while using three semiconductor elements 20a linearly disposed in series in one direction as one unit. For this purpose, as described before, the lands 30 for bonding the external connection terminals 34 are arranged on the electrode terminal-forming surface of the semiconductor element 20b to be disposed on the mounting surface, and are electrically connected to the electrode terminals 26 of the other semiconductor elements 20a via the re-wiring patterns 28. As shown in the drawing, the re-wiring pattern 28 is formed to be electrically connected to the land 30 while passing through the boundary of the adjacent semiconductor element 20a. The re-wiring pattern 28 is supported by the insulating layer 24. As the insulating layer 24 covers all over the surface of the semiconductor wafer 20, the re-wiring pattern 28 never cut on the boundary of the adjacent semiconductor element. In this regard, the electrode terminal of the semiconductor element 20b to be disposed on the mounting surface side is, of course, electrically connected to the land 30 via the re-wiring pattern.

FIG. 1(*d*) illustrates a characteristic manufacturing process in this embodiment, in which grooves 40 are formed in the vicinity of the boundaries of the adjacent semiconductor elements 20a on the rear surface of the semiconductor wafer 20. The machining of the grooves is carried out by using a groove-machining rotary edge to remove a base material of the semiconductor wafer 20 from the rear surface of the semiconductor wafer 20 so that the cover layer 22 in the vicinity of the boundary of the adjacent semiconductor element 20a is left. By this groove-machining, a vacant space of a predetermined width is formed between adjacent semiconductor elements which are coupled to each other by the cover layer 22. The grooves 40 are provided for folding the cover layer 22 to stack the semiconductor elements with each other, and are formed at a distance necessary for stacking the semiconductor elements together.

In FIG. 2(*e*), the semiconductor wafer 20 has been groove-machined. The groove 40 is formed by removing the base material from the rear surface of the semiconductor wafer 20 to an adhesion surface between the semiconductor wafer 20 and the insulating layer 24.

In the groove-machining, the base material of the semiconductor wafer 20 is removed from the cover layer 22. However, when the cover layer 22 keeps a required strength even if it is somewhat cut, the rotary blade may slightly enter the insulating layer 24 during the formation of the groove. If the rotary edge is allowed to slightly get into the insulating layer 24, it is possible to assuredly remove the base material of the semiconductor wafer 20.

A purpose of the groove-machining is to fold the semiconductor elements to stack together while using the cover layer 22 as a flexible support, and therefore, the groove may be formed in the boundary region between the adjacent semiconductor elements corresponding to a folding position, and it is unnecessary to carry out the groove-machining at all positions for dividing the semiconductor wafer 20 into individual pieces.

In FIG. 1(*e*), the semiconductor wafer 20 is cut along lines 41 into one unit including three semiconductor elements 20a and 20b forming one semiconductor device. In the drawing, the semiconductor wafer 20 cut into a unit of three semiconductor elements. When cutting, the semiconductor wafer 20 is cut at a position in coincidence with the groove-machined boundary of the residual adjacent semiconductor element.

As the semiconductor elements are arranged both in the vertical and horizontal directions in the semiconductor wafer 20, it is possible to machine the semiconductor wafer 20 by continuously moving a dicing edge or others relative to the semiconductor wafer 20 when the semiconductor wafer 20 is groove-machined or cut into individual units for forming one semiconductor device.

In FIG. 1(*f*), a semiconductor device 50 formed by folding one unit separated from the semiconductor wafer 20 is illustrated.

FIG. 4(*a*) is an enlarged view of the semiconductor device 50 including two semiconductor elements 20a and 20b which are connected and folded as one unit. FIG. 4(*b*) is an enlarged view of the semiconductor device 50 shown in FIG.

1(*f*). In the one unit separated from the semiconductor wafer 20, adjacent semiconductor elements 20*a* are connected with each other by the cover layer 22 including the flexible insulating layer 24, and it is possible to form the semiconductor device 50 in which the semiconductor elements 20*a* are stacked together by folding the cover layer 22, as shown in FIG. 4(*b*). The stacked semiconductor elements may be adhered to each other with an adhesive. The respective semiconductor element 20*a* and 20*b* is electrically connected to the external connection terminal 24 via the re-wiring pattern 28 formed in the cover layer 22, and by mounting the semiconductor device onto a mounting board via the external connection terminal 34, all the semiconductor elements 20*a* are electrically connected to the mounting board.

The insulating layer 24 is freely foldable, and the re-wiring pattern 28 is also foldable, in conformity with the insulating layer 24, while maintaining the electrical conductivity, if it is thin enough. By forming the protective film 32 to have a required flexibility, the cover layer 22 is also easily foldable.

While three semiconductor elements 20*a* and 20*b* are coupled in series to form one semiconductor device 50 in FIG. 4(*b*), the number of semiconductor elements 20*a* coupled by the cover layer 22 is not limited to three. In FIG. 4(*c*), four semiconductor elements 20*a* and 20*b* are coupled to each other in series to form one semiconductor device 50. In the same manner, as shown in FIG. 4(*d*), four semiconductor elements are coupled to each other, but two pairs 20*a* and 20*b* of them are stacked together.

In this regard, when the semiconductor elements are coupled by the flexible cover layer 22 and stacked together by folding the cover layer 22 to form the semiconductor device, the arrangement of the semiconductor elements coupled by the cover layer 22 is not limited to the series arrangement. For example, a plurality of semiconductor elements may be arranged in series and such groups of semiconductor elements are arranged in the direction vertical to the series arrangement. Also, when the cover layer 22 is folded to stack the semiconductor elements, the stacking method may be suitably selectable. When it is impossible to linearly cut the semiconductor wafer 20 or to carry out the groove-machining, a laser beam may be used for this purpose.

In FIGS. 5(*a*) to 5(*f*), a second embodiment of the inventive method for manufacturing a semiconductor device is illustrated. Also in this embodiment, in the similar manner as described with reference to the preceding embodiment, the re-wiring patterns are formed for electrically connecting the semiconductor elements in a wafer stage, and the flexible cover layer 22, covering the electrode terminal-forming surface of the semiconductor wafer 20, is folded to manufacture a semiconductor device in which a plurality of semiconductor elements are stacked together.

In FIG. 5(*a*), the semiconductor wafer 20 is illustrated. In FIG. 5(*b*), a characteristic manufacturing process in this embodiment is illustrated, in which the semiconductor wafer 20 is half-cut in the thickness direction in coincidence with the boundaries A of the semiconductor elements formed at a predetermined arrangement in the semiconductor wafer 20. Reference numeral 42 denotes a separation groove formed by half-cutting the semiconductor wafer 20 in the thickness direction.

The operation for forming the separation grooves 42 on the electrode terminal-forming surface of the semiconductor wafer 20 is carried out in a later step when the rear surface of the semiconductor wafer 20 is ground to reduce the thickness of the semiconductor wafer 20, the separation groove 42 will communicate with the rear surface of the semiconductor wafer 20 to individually divide the semiconductor elements formed in the semiconductor wafer 20. In such a manner, the depth of the separation groove 42 provided in the semiconductor wafer 20 is determined in accordance with an amount of ground material when semiconductor wafer 20 is ground from the rear surface of the semiconductor wafer 20 to reduce the same.

In FIG. 5(*c*), the cover layer 22 including the insulating layer 24 is formed on the electrode terminal-forming surface of the semiconductor wafer 20. The insulating layer 24 may be formed, for example, by laminating a polyimide film of 10 to 25 μm thick with the electrode terminal-forming surface of the semiconductor wafer 20. Thereby, the insulating layer 24 (film member) is formed over the separation grooves 42 on the electrode terminal-forming surface of the semiconductor wafer 20.

In FIG. 5(*e*), the rear surface of the semiconductor wafer 20 has been ground. Reference numeral 42*a* denotes a divided groove communicated with the rear surface of the semiconductor wafer 20. By communicating the divided groove 42*a* with the rear surface of the semiconductor wafer 20, there is solely the cover layer 22 in the boundary of the adjacent semiconductor element 20*a*, and the semiconductor elements 20*a* adjacent to each other are coupled with each other by the cover layer 22.

In FIG. 5(*f*), the cover layer 22 is cut along the lines 41 on the groove 42*a* so that three semiconductor elements forming one semiconductor device are defined as one unit from the semiconductor wafer in which all the semiconductor elements are coupled together by the cover layer 22. The semiconductor wafer 20 is divided into individual units, each consisting of three semiconductor elements, and the respective semiconductor elements 20*a* in the unit thus obtained are coupled together by the flexible cover layer 22. The semiconductor elements 20*a* obtained while coupled with each other by the cover layer 22 are stacked together, by folding the cover layer 22, to form a semiconductor device.

As described above with reference to the respective embodiments, according to the inventive method for manufacturing a semiconductor device, as the flexible cover layer 22 is formed in a stage of the semiconductor wafer 20, it is possible to obtain a structure in which a plurality of semiconductor elements to constitute one semiconductor device are coupled by the cover layer 22. Also, by folding the cover layer 22, a semiconductor device in which the semiconductor elements 20*a* are stacked together is easily obtainable.

In a case of the inventive process, as the wiring layer is formed in a stage of a semiconductor wafer, it is unnecessary to prepare a flexible wiring board for mounting the semiconductor elements separately from the semiconductor elements. Also, as the semiconductor elements 20*a* are formed integral with the cover layer 22, the operation for mounting the semiconductor elements on a flexible wiring board is unnecessary. A process for mounting the semiconductor elements on the flexible wiring board and sealing the former with resin is also unnecessary.

As described hereinbefore, according to the inventive process for manufacturing a semiconductor device, by forming the re-wiring pattern or cutting the grooves in a stage of a semiconductor wafer, it is possible to easily manufacture a semiconductor device in which a plurality of semiconductor elements are stacked together. Also, as the re-wiring pattern is formed in a stage of a semiconductor wafer which is then divided into individual semiconductor elements to form a semiconductor device, the resultant product is extremely compact in size as a laminated type semiconductor device.

It will be understood by those skilled in the art that the foregoing description relates to only some of the preferred embodiments of the disclosed invention, and that various changes and modifications may be made to the invention without departing the sprit and scope thereof.

The invention claimed is:

1. A process for manufacturing a semiconductor device, said process comprising:

covering an electrode terminal forming surface of a semiconductor wafer, on which a plurality of semiconductor elements are formed and arranged, with a cover layer comprising a flexible insulating film on which re-wiring patterns are formed, to adhere said cover layer to said electrode terminal forming surface in such a manner that electrode terminals of the semiconductor elements are electrically connected with connecting terminals of the re-wiring patterns;

forming said semiconductor wafer with grooves from a surface opposite to said electrode terminal forming surface thereof, so that said grooves extend along boundary lines of said respective semiconductor elements;

dividing said semiconductor wafer with said cover layer to obtain a plurality of units, each unit comprising a plurality of said divided semiconductor elements and a single sub-divided cover layer to define a single semiconductor device; and folding said divided cover layer of said respective divided unit along said grooves, so that at least some of said semiconductor elements in the respective unit are stacked.

2. A process as set forth in claim 1, wherein said semiconductor wafer is divided by said cover layer in such a manner that, in each unit, a plurality of said semiconductor elements are connected one by one in series.

3. A process as set forth in claim 1, wherein said process further comprises:

forming said re-wiring patterns on said flexible insulating film and, simultaneously, forming lands, on an area of said flexible insulating film to be a mounting surface of the resulted semiconductor device; and attaching external connection terminals to said lands.

4. A process as set forth in claim 1, wherein said process further comprises:

grinding the surface opposite to said electrode terminal forming surface of the semiconductor wafer to reduce a thickness of said semiconductor wafer, before said semiconductor wafer is formed with grooves from said opposite surface.

* * * * *